(12) United States Patent
Agarwal et al.

(10) Patent No.: US 7,709,923 B2
(45) Date of Patent: May 4, 2010

(54) METAL-BASE NANOWIRE TRANSISTOR

(75) Inventors: Prabhat Agarwal, Brussels (BE); Godefridus A. M. Hurkx, Best (NL)

(73) Assignee: NXP B.V., Eindhoven (NL)

( * ) Notice: Subject to any disclaimer, the term of this patent is extended or adjusted under 35 U.S.C. 154(b) by 236 days.

(21) Appl. No.: 12/093,790

(22) PCT Filed: Oct. 29, 2006

(86) PCT No.: PCT/IB2006/053995

§ 371 (c)(1),
(2), (4) Date: May 16, 2008

(87) PCT Pub. No.: WO2007/057802

PCT Pub. Date: May 24, 2007

(65) Prior Publication Data

US 2008/0237574 A1  Oct. 2, 2008

(30) Foreign Application Priority Data

Nov. 18, 2005  (EP)  ................................. 05110934

(51) Int. Cl.
*H01L 27/095* (2006.01)

(52) U.S. Cl. ............... 257/474; 257/479; 257/E29.178; 977/936

(58) Field of Classification Search ................. 257/474, 257/479, E29.178, 377; 977/936
See application file for complete search history.

(56) References Cited

U.S. PATENT DOCUMENTS 7,170,120 B2 * 1/2007 Datta et al. ................. 257/288
2002/0175408 A1 11/2002 Majumdar et al.

FOREIGN PATENT DOCUMENTS

WO  2004088755 A1  10/2004

OTHER PUBLICATIONS

Hensel, J. C; et al "Transistor Action in SI/COSI2/SI Heterostructures" Applied Physics Letters USA, vol. 47, No. 2, Jul. 15, 1985.

* cited by examiner

*Primary Examiner*—Tu-Tu V Ho

(57) ABSTRACT

A metal-base transistor is suggested. The transistor comprises a first and a second electrode (2, 6) and base electrode (6) to control current flow between the first and second electrode. The first electrode (2) is made from a semiconduction material. The base electrode (3) is a metal layer deposited on top of the semiconducting material forming the first electrode. According the invention the second electrode is formed by a semiconducting nanowire (6) being in electrical contact with the base electrode (3).

8 Claims, 3 Drawing Sheets

METAL-BASE NANOWIRE TRANSISTOR

The present invention is related to a transistor having a base electrode made out of metal and an emitter or collector, which is formed by a semiconducting nanowire.

Several decades ago a metal-base transistor (MBT) has been proposed as a high-speed device. It was hoped that the MBT would achieve a much higher performance than bi-polar-junction transistors. Best performance for MBTs was obtained by using silicon (Si) as emitter, gold (Au) as base and germanium (Ge) as collector. However, the theoretical advantages of the MBT concept could not be realized in commercially available devices mainly because of the difficulties to fabricate such a device. In particular, it is difficult to obtain a mono-crystalline semiconductor layer on top of the metal-based layer. Therefore, on the one side still today MBTs have not replaced bi-polar junction transistors as high speed devices. On the other side bi-polar transistors have seen a tremendous evolution in performance of the years due to vertical down-scaling of the transistor structure. I.e. the thickness of the semiconductor layers forming the vertical transistor structure has been made ever thinner over the years. This effect can be explained as follows: As the transport speed for charge carriers is limited, there is an inherent delay time or transfer time associated with the transfer of the signal across the layers forming the transistor. By reducing the thickness of the layers the transfer time is reduced as well. Today bi-polar devices are limited by charge storage in the emitter-base junction. The associated capacitance together with a differential input resistance accounts for more than 50% of the over all delay of a modern bi-polar transistor. In spite of the progress that has been made, there still remains a need for even faster transistors.

The invention therefore suggests a metal-base transistor because it stores significantly less charge in the depletion layer of the base. Also, depending on the specific processing technologies used to fabricate the MBT it may have reduced sensitivity to defects in the depletion layer.

Specifically, the invention suggests a transistor comprising a first and a second electrode and base electrode to control current flow between the first and second electrode. The first electrode is made from a semiconductor material. The base electrode is a metal layer deposited on top of the semiconducting material forming the first electrode. According the invention the second electrode is formed by a semiconducting nanowire being in electrical contact with the base electrode.

A nanowire is a structure having a few nanometers (nm) in diameter while in the longitudinal direction it may have a length in the order of micrometers ($\mu$m). Due to the small scale in the lateral directions quantum mechanical effects play an important role. Therefore, nanowires are sometimes also called "quantum wires".

In one embodiment of the invention the base is made from a transition metal silicide. More specifically, the transition metal can be selected from the group of cobalt and nickel. Advantageously, the nanowire may then be grown on the base electrode.

In one embodiment of the invention the nanowire is made from silicon and/or germanium. In this case the nanowire can be composed of a semiconductor heterostructure.

For some applications it may be useful that the composition of the nanowire heterostructure changes in radial direction of the nanowire.

For other applications it may be useful that the composition of the nanowire heterostructure changes in axial direction of the nanowire.

The invention will be better understood and other particular features and advantages will become apparent on reading the following description appended with drawings. It shows:

Figure 1:
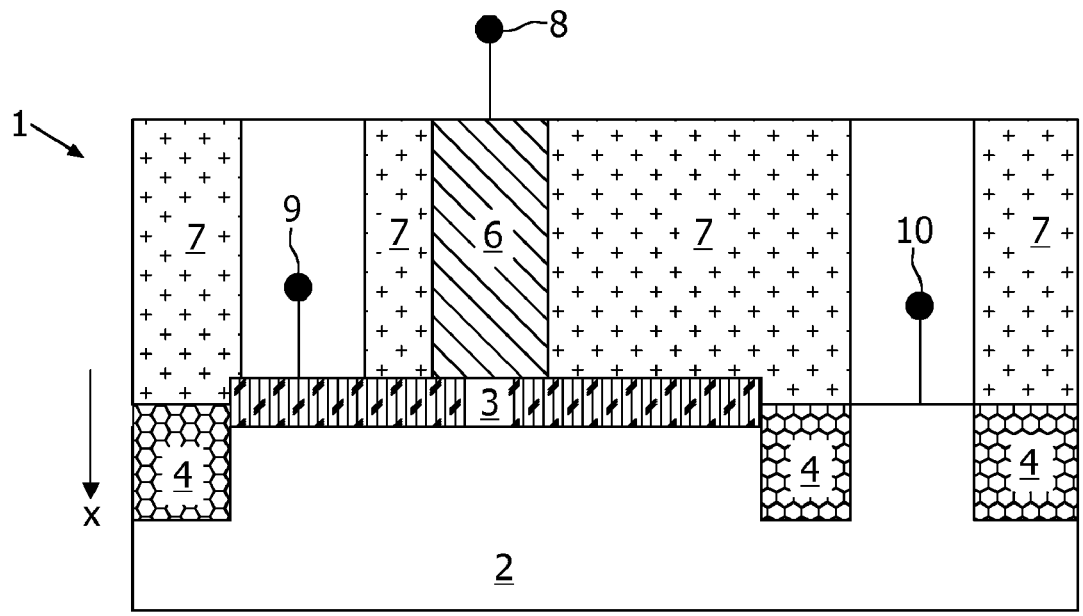
FIG. 1 is a schematic diagram of the metal-base transistor according to the invention.

FIGS. 3a to 3e display the sequence of manufacturing steps to fabricate the metal-base transistor shown in FIG. 1.

FIG. 1 illustrates a schematic diagram of an embodiment of the metal-base transistor according to the invention. It is noted that the dimensions in FIG. 1 do not scale and are given only for illustrative purposes. At first the structure of the transistor will be described. Further below one possible method to fabricate the transistor is disclosed.

In FIG. 1 the transistor as a whole is designated with the reference number 1. The transistor 1 is arranged on top of a highly n-doped silicon wafer forming a substrate 2. Though the precise value of the doping level depends on the chosen materials and their relative band alignments, in the present embodiment the doping level is in the order of $10^{-19}$ cm$^{-3}$. A thin monocrystalline metal layer 3 is arranged on top of the substrate 2. The metal layer 3 is a metal silicide like CoSi$_2$ or NiSi$_2$ and has a thickness of a few nm. The transistor 1 is structured laterally by insulating regions 4 fabricated by shallow trench insulation. The top side of the metal layer 3 is in contact with a nanowire 6, which is grown directly on the metal layer 3. Typically, the nanowire is less than 100 nm in diameter and not longer that 500 nm. The nanowire is made from a single semiconductor like silicon (Si) or from different semiconductor materials like silicon and germanium (Si, Ge). Similar to the substrate 2 the nanowire 6 is highly n-doped. A dielectric isolation layer 7 is deposited on top of the device described so far for protection purposes. Finally, ohmic contacts are provided in windows in the dielectric isolation layer 7 to form an emitter contact 8 to the nanowire 6, a base contact 9 to the metal layer 3 and a collector contact 10 to the substrate 2.

Since the substrate 2 and the nanowire 6 are both highly n-doped semiconductor materials their roles in the transistor 1 can be exchanged. I.e. in another embodiment of the invention the nanowire 6 is the collector and the substrate 2 is the emitter of the transistor.

The main criteria determining the length of the nanowire is the thickness of the depletion layer inside the nanowire in its axial direction. The nanowire should be longer than the thickness of the depletion layer but not much longer. The nanowire can consist of different semiconductor materials along its length or radius. The former could enable better contact properties at the to of the nanowire e.g. by using a narrow band gap material at the top of the nanowire while the latter can improve the serial resistance of the nanowire due to a reduced sensitivity to surface defects. Semiconductor materials having different band gaps and that can be combined in a single nanowire are e.g. Si and Ge. However, the invention is not limited to these materials. In principle it is also applicable to semiconductors comprising elements from group III and V of the periodic system such as GaAs, Al$_{1-x}$Ga$_x$As, InAs, InP etc. These so called III-V semiconductors can mainly be utilized on a III-V semiconductor wafer as substrate.

Figure 2:
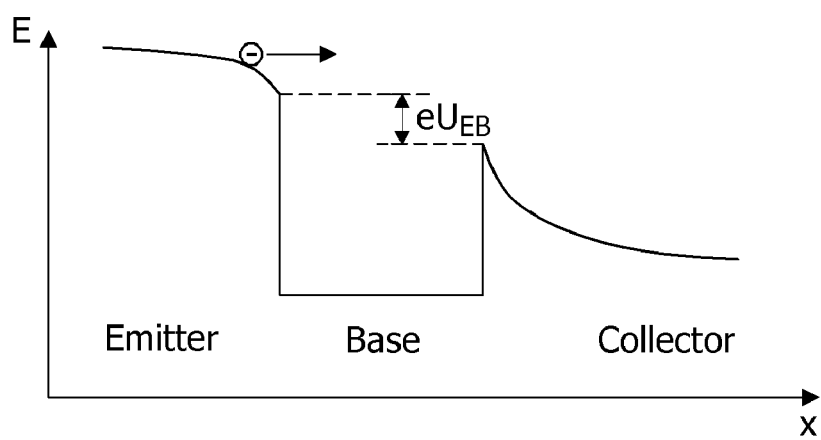
FIG. 2 is a band diagram of the transistor shown in FIG. 1.

In FIG. 2a band diagram of the transistor is shown, while an emitter-base voltage $U_{EB}$ is applied. The ordinate of the diagram describes the energy E, and the abscissa corresponds to the normal direction X of the wafer indicated in FIG. 1 by an arrow. As can be seen, electrons of the emitter are injected across the base layer and over the Schottky barrier between the base and the collector.

In the following description and with reference to FIGS. 3a to 3e one possible sequence of processing steps is suggested to fabricate a metal-base transistor according to the invention. It is noted that the described processing method is only one exemplary method and a person skilled in the art may conceive many variations from the disclosed processing method depending on the specific parameters of the device to be made.

The fabrication process begins with a standard n-type silicon substrate 2 which is made highly n-type doped by means of implantation. The doping level is in the order of $10^{-19}$ cm$^{-3}$ and is achieved by implantation of arsenic (As) or phosphor (P) ions. A commercially available implanter is used for this step.

Figure 3A:
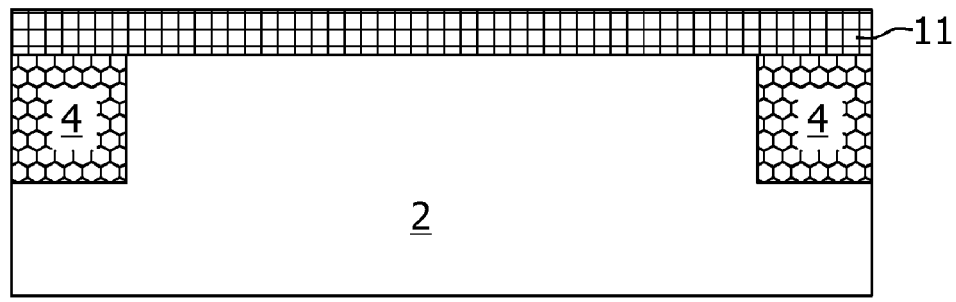
Figure 3B:
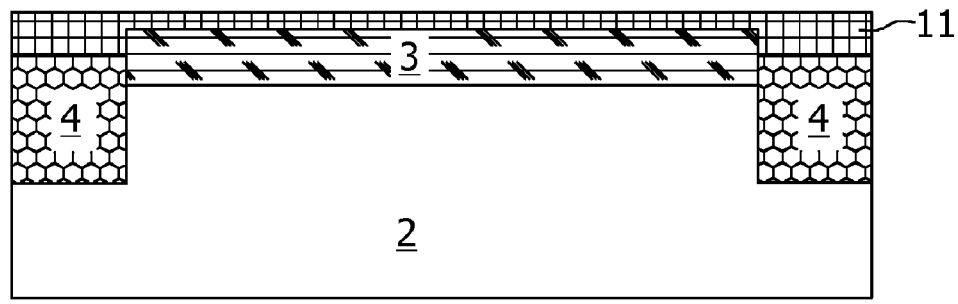

After implantation the substrate is patterned e.g. by shallow trench isolation to form isolated regions on the substrate. The shallow trench isolation is achieved by etching a shallow trench into the silicon substrate with a small aspect ratio. Standard dry or wet etching technologies can be used for this step. Subsequently, silicon oxide 4 is deposited into the trench regions. After planarization of the substrate a thin layer of silicide precursor metal 11 is deposited on top of the substrate. Nickel or cobalt are used as metals in the present embodiment of the invention. However, other silicides can be used in other embodiments, e.g. $TiSi_2$, $TaSi_2$, $MoSi_2$, $WSi_2$ and PtSi. The deposition can be made either by sputtering or—for better interface quality—with advanced techniques like atomic layer deposition. During a thermal annealing step the precursor metal reacts with the silicon of the substrate to form a metal silicide 3. As can be seen in FIG. 3b, even after the annealing step there remains a thin layer of unreacted precursor metal 11 on top of the silicide layer 3. Obviously, the precursor metal 11 does not react in region of the deposited silicon oxide 4 as it is apparent from FIG. 3b. This processing step is called a partial silicidation step.

Figure 3C:
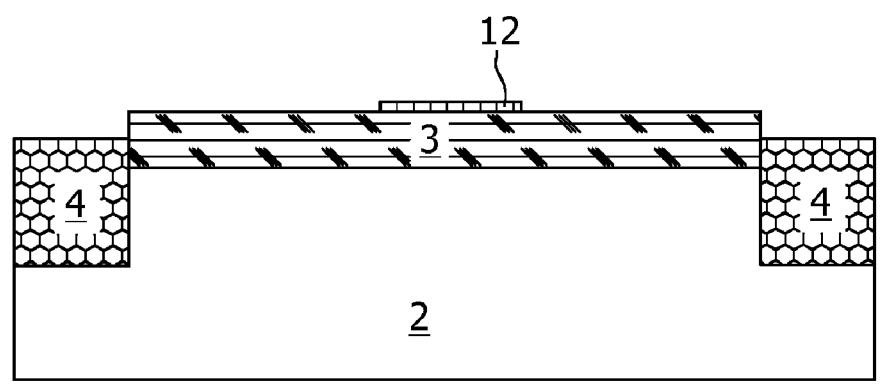

By a standard optical lithography a catalyst region 12 is defined in the top precursor metal layer 11. Subsequently, the exposed unreacted metal is etched away by a standard wet etch technique (FIG. 3c).

Figure 3D:
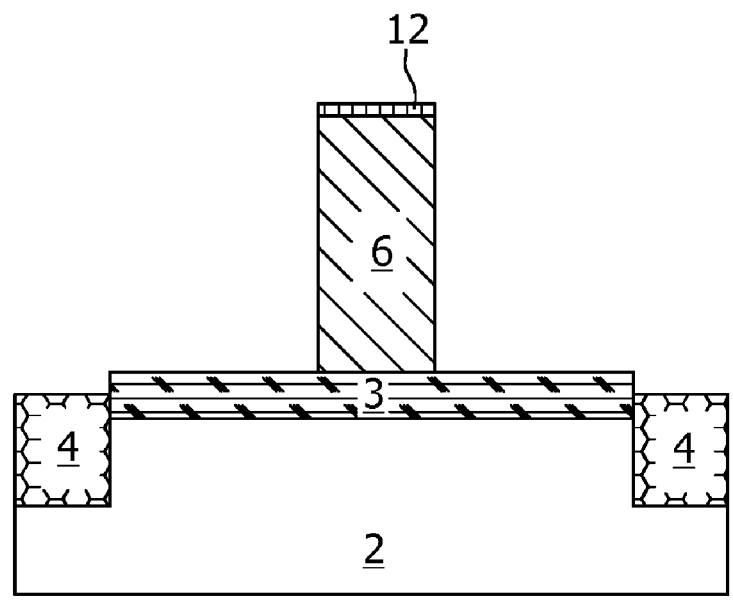

The remaining photo resist residing on the catalyst region 12 is removed with an appropriate solvent. The unreacted metal in the catalyst region 12 is then used as a catalyst for the growth of a semiconducting nanowire using the VLS technique as it is shown in FIG. 3d.

It is well known that a catalytic decomposition of a silicon containing gas by gold or iron can form long nanowires. This technique is usually called the vapor-liquid-solid (VLS) mechanism. A liquid nano droplet containing the metal and silicon is located at the tip of the growing wire. Unfortunately, gold and iron have a large diffusion coefficient in silicon and create deep electronic levels which are detrimental to the electronic performance of the finalized device. Therefore, metal silicides are much more preferred in semiconductor processing technologies when ever a metallic layer is necessary. For the present invention nickel and cobalt silicides have been used but in the following the process based on cobalt is described for the sake of simplicity but without limiting the scope of the invention.

According to a proposed method a cobalt layer is deposited by chemical vapor deposition (CVD) on commercially available silicon substrates. $CoCl_4$ gas is introduced in a reactor in a $H_2$ ambiance. The partial pressure of $CoCl_4$ is 0.06 Pascal and the total reactor pressure is 670 Pascal. On the surface of the silicon substrate the $CoCl_4$ reacts with the silicon of the substrate and forms $CoSi_2$. The deposition temperature of the substrate is chosen to be in the range of 600 to 700° C. In a subsequent annealing step at elevated temperatures in the order of 900° C. the formation of cobalt silicide is terminated. For growing silicon nanowires on the cobalt silicide, the substrate is exposed to an atmosphere in the reactor of $SiH_2Cl_2$ with a partial pressure of 70 Pascal in a 2.7 Kilopascal hydrogen atmosphere at temperatures around 650° C. Under these conditions silicon nanowires are growing on the cobalt silicide.

If it is desired to grow the nanowire as a silicon/germanium heterostructure a laser is utilized to evaporate germanium in the furnace from a solid target. The laser beam heats up the surface of the germanium target placed inside the furnace until germanium atoms are evaporated. The evaporated germanium atoms are then incorporated into the nanowire. Depending on the growth conditions it is possible to grow the nanowire as a axial Si/Ge heterostructure, i.e. the composition of the nanowire changes in its axial direction. One dimensional growth is maintained as long as the reacted decomposition takes place preferably at the interface between the cobalt silicide and the nanowire. Similarly, the Ge atoms evaporated from the Ge target are also incorporated into the growing nanowire at the interface between the cobalt silicide and the nanowire. By turning the silicon and germanium supplies alternatively on and off a nanowire is grown having a Si/Ge heterostructure in the axial direction of the nanowire.

The nanowire becomes n-type doped by adding arsine ($AsH_3$) or phosphine ($PH_3$) to the incoming gas stream. The doping level is determined by the partial pressure of the arsine or phosphine gas.

Under different growth conditions it is also possible to grow the nanowire as a radial Si/Ge heterostructure, i.e. the composition of the nanowire changes in its radial direction. In order to achieve a radial heterostructure the growth conditions have to be selected such that the reactants decompose homogenously on the whole surface of the nanowire and create a shell having a different composition than the core nanowire that has been grown at the beginning.

It is noted that the term "heterostructure" means in the present context a nanowire having a composition of different materials like silicon and germanium, the same material e.g. silicon having different doping types like n-type doped silicon and p-type doped silicon, and finally, the same material like silicon having different crystal orientations in the axial or radial direction of the nanowire. A radial heterostructure of a nanowire which is modulation doped e.g. of the surface of the nanowire can be very advantageous in the sense of a high majority carrier mobility.

Figure 3E:
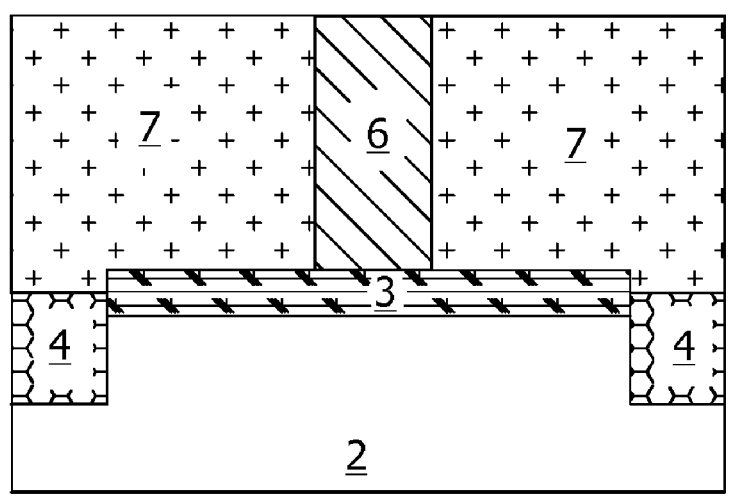

Finally, silicon nitride ($Si_3N_4$) is deposited as dielectric isolation 7 on top of the transistor structure as it is shown in FIG. 3e. Windows are opened in the dielectric isolation 7 and contacts are made according to well-known technologies for making ohmic contacts. If required special contacts to the nanowire can be made by using extra masking steps.

The invention claimed is:

1. Transistor comprising a first, a second electrode, and base electrode to control current flow between the first and second electrode, wherein the first electrode is made from a semiconducting material, wherein the base electrode is a metal layer deposited on top of the semiconducting material forming the first electrode, characterized in that the second electrode is formed by a semiconducting nanowire being in electrical contact with the base electrode.

2. Transistor according to claim 1 characterized in that the nanowire is growing on the base electrode.

3. Transistor according to claim 1 characterized in that the base electrode is made from a transition metal silicide.

4. A transistor according to claim 3 that the transition metal is selected from the group of cobalt and nickel.

5. Transistor according to claim 1 characterized in that the nanowire is made from silicon and/or germanium.

6. Transistor according to claim 5 characterized in that the nanowire is composed of a semiconductor heterostructure.

7. Transistor according to claim 6 characterized in that the composition of the nanowire heterostructure changes in radial direction of the nanowire.

8. Transistor according to claim 6 characterized in that the composition of the nanowire heterostructure changes in axial direction of the nanowire.

* * * * *